United States Patent
Dietz et al.

(10) Patent No.: US 11,841,407 B2
(45) Date of Patent: Dec. 12, 2023

(54) APPARATUS FOR MAGNETIC RESONANCE IMAGING, AND METHODS FOR THE DESIGN AND MANUFACTURE THEREOF

(71) Applicant: Siemens Healthcare Limited, Camberley (GB)

(72) Inventors: Peter Dietz, Fürth (DE); Andreas Krug, Fürth (DE); Michael Mallett, Faringdom (GB); Marco Bevilacqua, Oxford (GB)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 17/636,570

(22) PCT Filed: Jul. 16, 2020

(86) PCT No.: PCT/EP2020/070138
§ 371 (c)(1),
(2) Date: Feb. 18, 2022

(87) PCT Pub. No.: WO2021/032375
PCT Pub. Date: Feb. 25, 2021

(65) Prior Publication Data
US 2022/0283250 A1   Sep. 8, 2022

(30) Foreign Application Priority Data
Aug. 21, 2019  (GB) ..................... 1912001

(51) Int. Cl.
*G01R 33/38* (2006.01)
*G01R 33/3815* (2006.01)

(52) U.S. Cl.
CPC ..... *G01R 33/3804* (2013.01); *G01R 33/3802* (2013.01); *G01R 33/3815* (2013.01)

(58) Field of Classification Search
CPC ............ G01R 33/3804; G01R 33/3802; G01R 33/3815; G01R 33/3854; H01F 6/04
See application file for complete search history.

(56) References Cited

U.S. PATENT DOCUMENTS

2003/0006773 A1   1/2003 Ries
2007/0257042 A1   11/2007 Gore et al.
(Continued)

FOREIGN PATENT DOCUMENTS

| CN | 101220844 A | * 7/2008 | ................ E02F 3/40 |
| GB | 2437964 A | 11/2007 | |
| GB | 2490478 A | 11/2012 | |

(Continued)

*Primary Examiner* — Daniel R Miller
(74) *Attorney, Agent, or Firm* — Banner & Witcoff Ltd.

(57) ABSTRACT

A device for use in magnetic resonance imaging (MRI) systems may include a superconducting main magnet coil; and a thermal radiation shield that encloses the superconducting main magnet coil. The shield may include an inner cylindrical bore tube, an outer cylindrical wall, and annular end walls welded between the annular cylindrical bore tube and the outer cylindrical wall to form a closed, hollow cylindrical vessel. A distribution of a position and length of welds that affix the annular end walls to the inner cylindrical bore tube may include a predetermined arrangement of welds of varying lengths interspersed with gaps of varying lengths.

19 Claims, 4 Drawing Sheets

(56) References Cited

U.S. PATENT DOCUMENTS

2012/0075045 A1   3/2012  Calvert
2016/0202332 A1   7/2016  Huang et al.

FOREIGN PATENT DOCUMENTS

| GB | 2503460 A | * | 1/2014 | ......... G01R 33/3815 |
| GB | 2586020 A |  | 2/2021 | |
| JP | H09291817 A | * | 11/1997 | |
| JP | 2003314449 A | * | 11/2003 | |

* cited by examiner

APPARATUS FOR MAGNETIC RESONANCE IMAGING, AND METHODS FOR THE DESIGN AND MANUFACTURE THEREOF

CROSS REFERENCE TO RELATED APPLICATIONS

This patent application is a U.S. National Stage Application of PCT/EP2020/070138, filed Jul. 16, 2020, which claims priority to Great Britain Patent Application No. 1912001.3, filed Aug. 21, 2019, each of which is incorporated herein by reference in its entirety.

BACKGROUND

Field

The present disclosure relates to improvements to apparatus for magnetic resonance imaging. In particular, it relates to the assembly of a thermal radiation shield in a magnetic resonance imaging apparatus to reduce mechanical oscillations caused by interaction of such thermal radiation shield with an oscillating gradient magnetic field.

Related Art

FIG. 1 shows an axial cross-section of an example conventional superconducting magnet assembly. The assembly is essentially symmetrical about axis A-A. Directions parallel to axis A-A will be referred to herein as "axial", while directions perpendicular to an axial direction will be referred to as "radial".

Main magnet coils 10 produce a static magnetic field of high strength. They are enclosed within a vacuum vessel 12 known as an Outer Vacuum Container (OVC). A thermal radiation shield 14 is interposed between the main magnet coils 10 and the OVC, to reduce the amount of thermal radiation from the OVC (at a temperature of approximately 300 K) which reaches the main magnet coils (at a temperature which may be as low as typically 4 K). In use, thermal radiation shield 14 may typically be at a temperature of about 50 K, and so may be referred to herein as a "50 K shield". Cryogenic refrigerators may be used to maintain the superconducting magnet at its operating temperature but have a limited cooling power at that temperature.

Magnet shield coils 16 are typically also provided, radially outside of the main magnet coils 10. The magnet shield coils 16 reduce the stray magnetic field and complement the main magnet coils 10 to produce a strong homogeneous field.

The OVC is made up of an inner cylindrical wall (bore tube) 12a, an outer cylindrical wall 12b and two annular, planar end walls 12c, joining the bore tube 12a to the outer cylindrical wall 12b to form an enclosed hollow cylindrical structure.

Similarly, the thermal radiation shield 14 is made up of an inner cylindrical wall (bore tube) 14a, an outer cylindrical wall 14b and two annular, end walls 14c, joining the bore tube 14a to the outer cylindrical wall 14b to form an enclosed hollow cylindrical structure.

The OVC bore tube 12a defines a cylindrical bore 18 within which a patient may be received for MRI imaging. Also within the bore 18 is a gradient and shimming assembly 20. In the illustrated example, the gradient and shimming assembly comprises main gradient coils 22, gradient shield coils 24 and a shim assembly 26.

Main gradient coils 22 typically comprise a number of resistive coils, arranged to generate time-variant magnetic fields in three orthogonal planes. They usually comprise suitably-shaped coils of copper or aluminium wire embedded in thermosetting resin.

Gradient shield coils 24 are located radially outside of main gradient coils 22 and perform a function analogous to that of the magnet shield coils 16. They complement the main gradient coils 22 to produce the required pattern of time-variant gradient fields within the bore 18 and reduce the amount of stray gradient fields which may reach the OVC bore tube 12a. The gradient coils are preferably designed to minimise the magnetic stray field incident perpendicular to the 50 K shield bore tube 14a. This is particularly important in case the thermal radiation shield bore tube 14a is made from high conductivity material such as aluminium, in which case large eddy currents will be generated if subjected to a time varying magnetic field.

Conventionally, shim assembly 26 is located between the main gradient coils 22 and the gradient shield coils 24. It is preferable for the gradient shield coils 24 to be located radially some distance from the main gradient coils 22 to be more effective.

In a conventional magnetic resonance imaging system, a cylindrical superconducting magnet assembly generates a high-strength static background magnetic field with high homogeneity in an imaging region, which imaging region is typically located approximately at the axial mid-point of the cylindrical superconducting magnet.

As part of the imaging process, oscillating gradient magnetic fields are generated by the gradient coils 22, 24. The gradient magnetic fields so produced typically oscillate in three mutually orthogonal directions to provide appropriately-timed varying magnetic fields for imaging. Typically, the gradient magnetic fields are required to provide a gradient in the Bz component of the magnetic field. While Bz is the dominant component, there are also components in Bx and By but they are orders of magnitude smaller, and can be ignored for present purposes. The required gradients, then, are gradients in Bz, the axially-directed field, in three orthogonal directions $\partial Bz/\partial x$, $\partial Bz/\partial y$, $\partial Bz/\partial z$, where x and y are orthogonal radial directions.

Conventional superconducting magnets operate at a cryogenic temperature, typically below 20 K and usually at or near 4.2 K. The parts of the system which are held at this temperature may be known as the "magnet cold mass" and will include main magnet coils 10, magnet shield coils 16, and associated components and support structure.

To reduce radiant thermal influx from the vacuum vessel to the magnet cold mass, it is typical to have a thermally conductive thermal radiation shield 14 interposed between the OVC 12 and the magnet cold mass. This thermal radiation shield 14 is typically cooled to a temperature in the region of 50 K, and may be referred to as a "50 K shield" for brevity. At such temperatures, greater cooling power is available from conventional cryogenic refrigerators than at temperatures of 20 K or less. Within the 50 K shield, much less thermal radiation is received on the cold mass from the thermal radiation shield at 50 K than would have been received from the vacuum vessel at 300 K in the absence of the 50 K shield.

Such thermal radiation shield 14 is typically formed from sheets of an electrically conductive material such as aluminium. The oscillating gradient magnetic fields interact with the electrically conductive thermal radiation shield to generate oscillating electrical currents within the thermal radiation shield. These oscillating electrical currents in turn interact with the static background magnetic field and generate mechanical oscillations in the system. Such interactions may be known as "gradient coil interaction".

Gradient coil ("GC") interaction between the superconducting magnet and gradient coils is transferred to the magnet cold mass by mechanical vibration of the 50 K shield due to eddy currents generated in the 50 K shield from rapidly oscillating gradient fields. The mechanical vibration of the 50 K shield in turn produces oscillating magnetic fields which reach the cold mass, in turn inducing eddy currents in the magnet cold mass which cause localized heating.

Typically, in a cylindrical superconducting magnet system, the thermal radiation shield 14 comprises an inner cylindrical wall 14a, called the bore tube; an outer cylindrical wall 14b, and two annular end pieces 14c, the whole forming a hollow cylindrical enclosure 14.

Conventionally, the cylindrical symmetry of the thermal radiation shield bore tube 14a and the axisymmetric geometry of the thermal radiation shield end pieces 14c are ideally shaped to produce mechanical resonances when excited by an external driving force, for example the oscillating magnetic field of gradient coils.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 schematically illustrates an axial cross-section of a conventional superconducting magnet.

Figure 1:
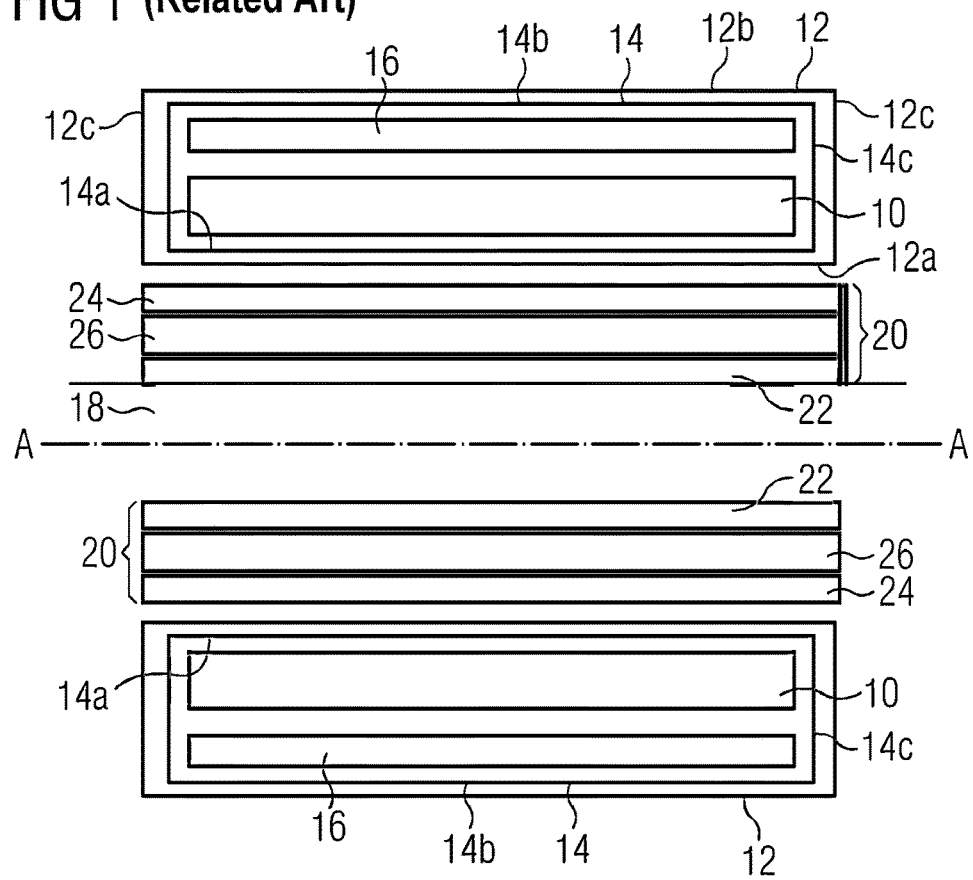

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

The present disclosure makes particular reference to cylindrical superconducting magnets, but the methods and structure of the present disclosure may be applied to other shapes and types of magnet.

The present disclosure addresses the tendency of the thermal radiation shield to enter mechanical resonance. By reducing the tendency of the thermal radiation shield to oscillate in mechanical resonance, the transfer of heat energy to the cold mass by gradient coil interaction may be reduced. Resonant mechanical oscillation is usually characterised by very large mechanical displacements at the resonant conditions. In the context of the present disclosure, this is where maximum energy will be transferred from the shield to the cold mass. The present disclosure aims to reduce the tendency of the thermal radiation shield to oscillate at resonant modes so that the shield will not transfer large amounts of energy at any given frequency.

The transfer of energy by mechanical vibrations caused by induced eddy currents has previously been dealt with by a number of techniques.

In one conventional arrangement, mechanical resonance conditions can be explicitly avoided by introducing 'forbidden' frequency bands into the gradient pulse sequence program, which controls current applied to the gradient coils—and so controls the variation in magnetic fields generated by the gradient coils. Software controlling the gradient pulse sequences is designed to avoid producing a resonant condition by avoiding pulse sequences which feature frequencies within the forbidden bands. However, this approach limits the flexibility of pulse sequence programming and any programmed sequence which observes these 'forbidden' frequency bands has reduced capability of accessing k-space as efficiently as it would if there were no 'forbidden' frequency bands.

Alternatively, or in addition, another conventional approach to reducing GC induced mechanical oscillation is to make the 50 K shield of thicker material. Increased thickness of the 50 K shield will stiffen it, which will reduce the amplitude of mechanical vibrations at the frequencies under consideration and therefore the energy transfer to the magnet cold mass will be reduced. The disadvantage to this approach is the increased cost due to increased material consumption, the increased weight of the 50 K shield leading to the need for more robust shield suspension, in turn leading to increased heat influx through the suspension arrangements. It also does not entirely eliminate the resonant conditions. The problematic resonant frequencies may simply be moved higher in frequency due to increased stiffness and may create similar problems at a different resonant frequency.

Alternatively, or in addition, another conventional approach to reducing GC induced mechanical oscillation is to provide slitting of the radiation shield, or making the shield of a laminated material, to limit the length of thermally conductive paths within the 50 K shield. Limited conductive path length will reduce or break up the generation of eddy currents within the 50 K shield. The disadvantage of these approaches is that the oscillating gradient magnetic fields will have greater opportunity to penetrate the 50 K shield and impinge directly on the magnet cold mass. If the magnet cold mass has significant conductive components then the heating of the magnet cold mass can still occur by direct generation of eddy currents from the stray oscillating gradient field penetrating through the slits, which heating can be of greater magnitude than if the 50 K shield was unmodified by slitting or lamination.

The design of the gradient shield coils may be optimised to minimise the perpendicular stray gradient field which interacts with the bore tube 14a of the 50 K thermal radiation shield 14. However, design of the gradient shield coils has not been found effective in addressing stray gradient field which interacts with the end walls 14c of the 50 K thermal radiation shield 14. Accordingly, even where the gradient shield coils are carefully designed to minimise the stray gradient field which interacts with the bore tube 14a of the 50 K thermal radiation shield 14, the end walls 14c may be susceptible to mechanical resonant behaviour. If a resonant mode of an end wall 14c is close in frequency to a resonant mode of the bore tube 14a there may be mechanical energy transfer between them. The present disclosure seeks to reduce symmetry in mechanical connections between end walls 14c and bore tube 14a and therefore reduce the likelihood of energy transfer at mechanical resonant modes from end walls 14c to bore tube 14a.

Excessive heating can lead to destabilization of the superconductor, causing a magnet quench. The present disclosure seeks to reduce the likelihood of such heating of the magnet cold mass by gradient coil interaction.

The present disclosure reduces the tendency of mechanical resonance of the end walls 14c of the thermal radiation shield coupling to the bore tube 14a of the thermal radiation shield to introduce mechanical resonance of similar frequency to the bore tube 14a. This may be achieved, according to some embodiments of the present disclosure, by introducing random or pseudo-random changes to the structure of the thermal radiation shield. The pseudo-random changes will change the boundary conditions of the end walls 14c of the thermal radiation shield and make it less likely that particular resonant modes can form.

In certain embodiments of the present disclosure, this is achieved by introducing pseudo-random changes into a welding pattern used to attach the thermal radiation shield bore tube 14b to thermal radiation shield end walls 14c.

It is an object of the present disclosure to provide a thermal radiation shield for use in a magnetic resonance imaging system, which is less susceptible to gradient induced mechanical oscillations. It is another object of the present disclosure to provide a magnetic resonance imaging system equipped with such a thermal radiation shield. It is a further object of the present disclosure to provide methods for manufacture of such a thermal radiation shield, and a yet further object of the present disclosure to provide methods for the design of such a thermal radiation shield.

The most significant gradient coil interaction with the magnet cold mass occurs within gradient field oscillation frequency bands related to mechanical resonance conditions of the system comprising the gradient coils, the 50 K shield and the magnet cold mass. Eliminating, or reducing, these resonance conditions would greatly reduce the amount of energy transferred to the cold mass, leading to lower levels of heating of the magnet cold mass. The present disclosure therefore seeks to reduce these resonant conditions by breaking up the geometric symmetry of the 50 K shield.

A typical thermal radiation shield, as described above, consists of an annular cylindrical bore tube 14a, an outer cylindrical wall 14b and annular end walls 14c. The annular end walls 14c are typically welded between the annular cylindrical bore tube 14a and the outer cylindrical wall 14b to form a closed, hollow cylindrical vessel. Typically, the weld between cylindrical bore tube 14a and annular end walls 14c, and between outer cylindrical wall 14b and annular end walls 14c, may be continuous around the circumference of the cylindrical bore tube 14a and/or outer cylindrical wall 14b, or may be intermittent, with welds of equal length interspersed with gaps of equal length. The length of the welds may or may not equal the length of the gaps.

Figure 2:
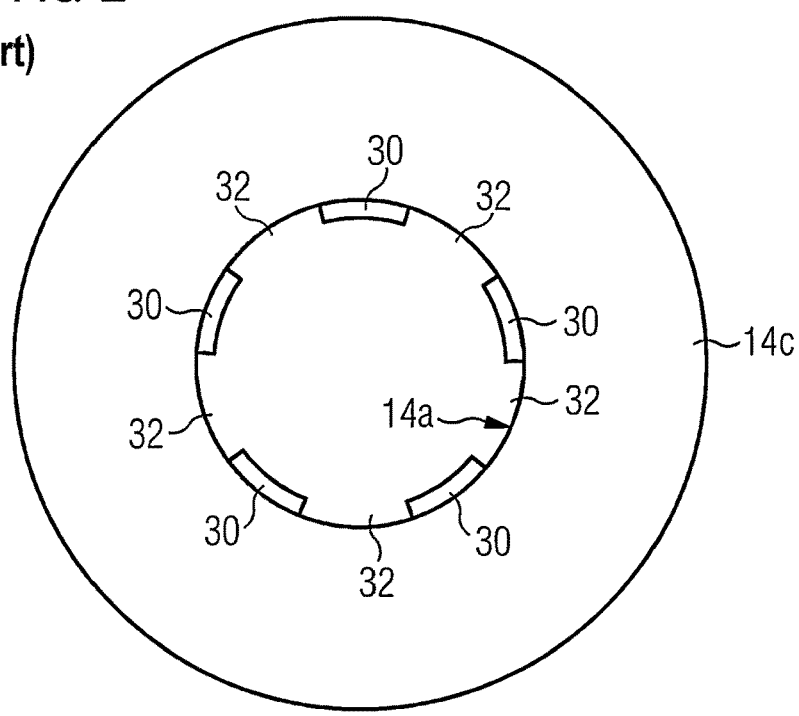
FIGS. 2 and 3 represent typical weld arrangements attaching a cylindrical bore tube to annular end walls, and between outer cylindrical wall and annular end walls.
Figure 3:
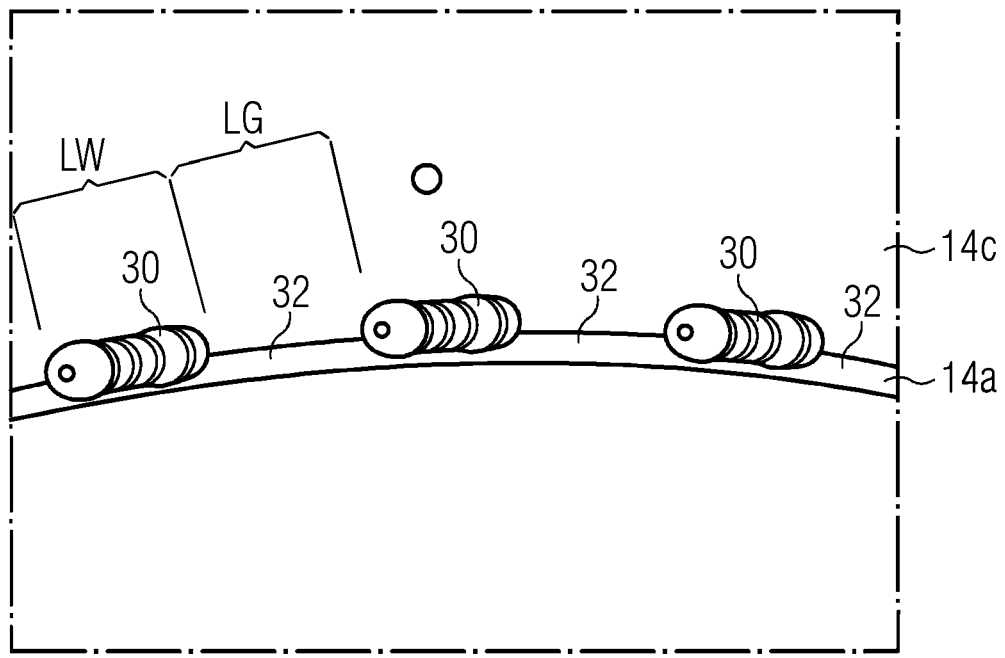

FIGS. 2 and 3 represent typical weld arrangements attaching a cylindrical bore tube 14a to annular end walls 14c, and between outer cylindrical wall 14b and annular end walls 14c. FIG. 2 presents a very schematic representation, while FIG. 3 shows a photograph of such an arrangement. Intermittent welds 30 are separated by gaps 32. Welds 30 are conventionally all of a same length LW and gaps 32 are conventionally all of a same length LG. In some conventional arrangements, these lengths may be the same LG=LW. Such symmetry in weld length and gap length may encourage particular resonant modes to form which match the boundary conditions of the edge welding.

Figure 4:
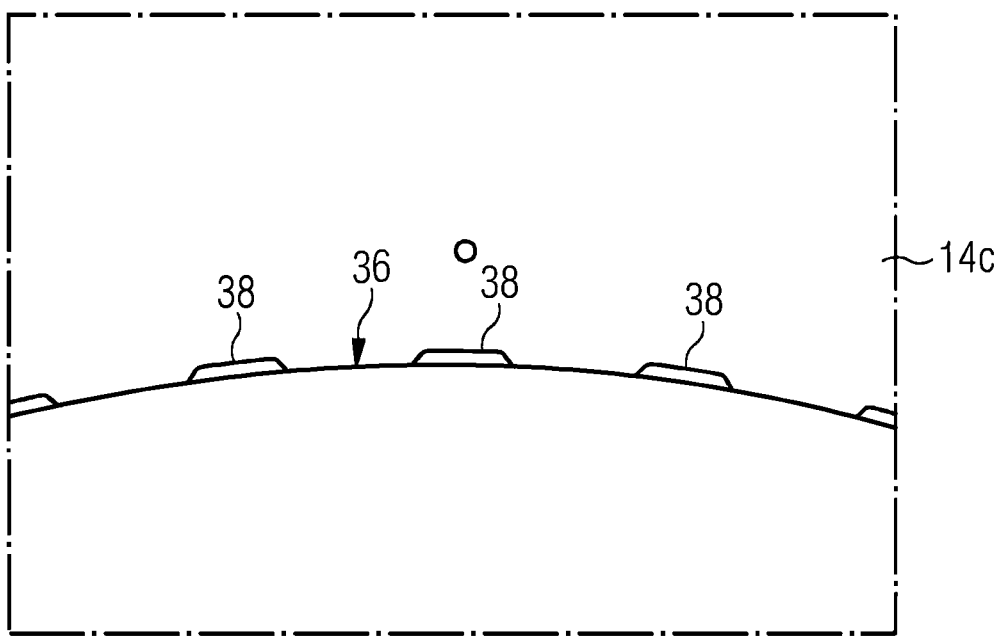
FIG. 4 represents a part of a radially inner extremity of a conventional thermal radiation shield wall.

FIG. 4 represents a part of a radially inner extremity of a conventional thermal radiation shield wall 14c. Arcuate radially inner edges 36 align with a feature of the bore tube 14a of the thermal radiation shield, such feature for example being an inner diameter, an outer diameter or a locating ridge, for example. Intermittently around the inner circumference of the end wall 14c are provided cutouts 38. These cutouts correspond to locations of the welds 30 in the finished thermal radiation shield, and provide access to both bore tube 14a and end wall 14c for effective welding.

Figure 5:
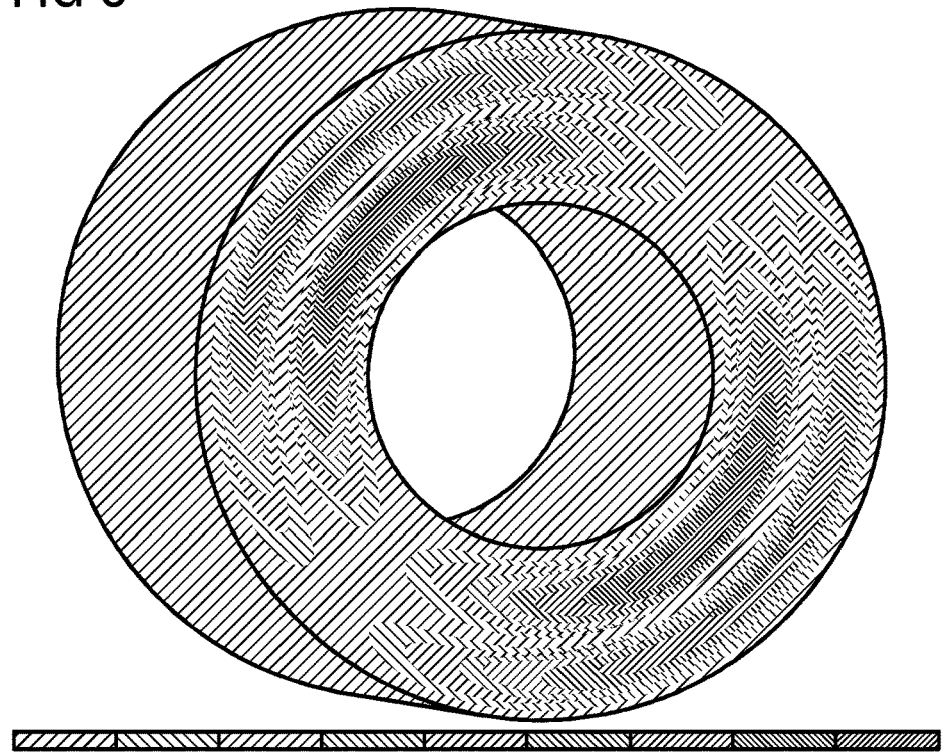
FIGS. 5 and 6 show simulation results, according to an exemplary embodiment, of resonance in an end wall of a conventional thermal radiation shield as represented in FIGS. 2-4 when subjected to mechanical oscillation at selected resonant frequencies.
Figure 6:
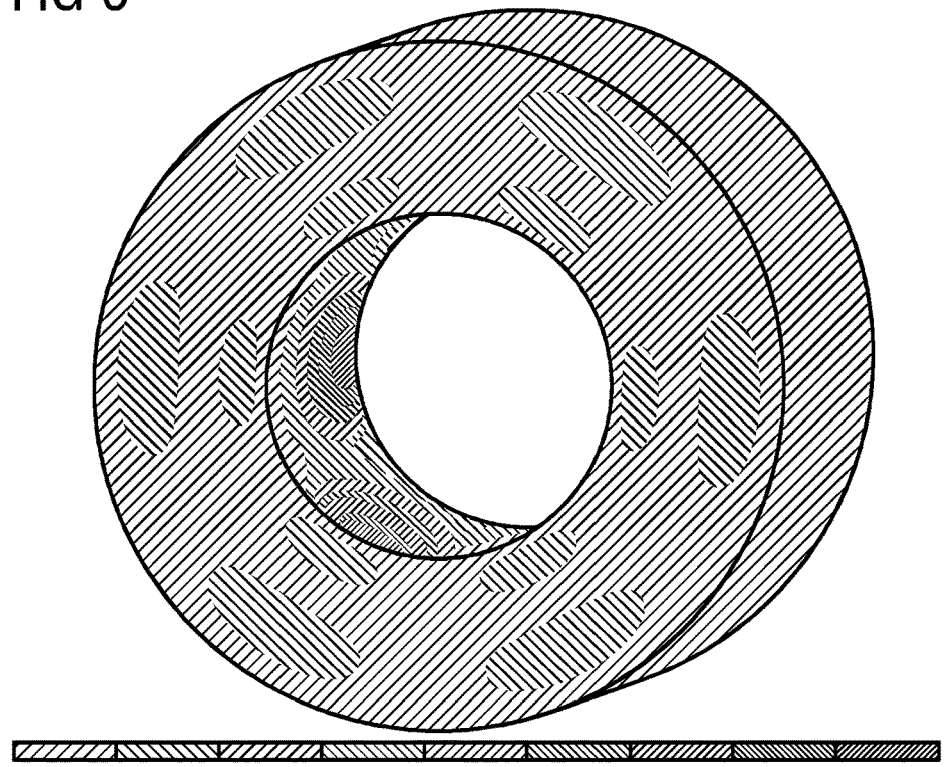

The repetitive and symmetrical nature of the arrangements of welds 30 and gaps 32 in a conventional thermal radiation shield has been found to enable mechanical resonance of the end walls 14c. FIGS. 5 and 6 show simulation results of resonance in an end wall 14c of a conventional thermal radiation shield 14 as represented in FIGS. 2-4 when subjected to mechanical oscillation at selected resonant frequencies. The representation shown in FIG. 5 is of a fundamental resonant frequency of the end wall 14c. FIG. 6 shows resonant modes on both the end walls 14c and the bore tube 14a at a similar frequency. These resonant modes couple strongly together, such that mechanical resonance in end wall 14c would excite the corresponding resonant mode in the bore tube 14a and vice versa. Such unwanted mechanical excitations of the end walls 14c may be transferred to the bore tube 14a of the thermal radiation shield 14 and thereby cause mechanical oscillation of the bore tube 14a of the thermal radiation shield, which cause distortion of the magnetic field within the imaging volume.

According to an embodiment of the disclosure, the mechanical resonance behaviour of the thermal radiation shield 14 in a superconducting MR magnet is adapted by interrupting the mechanical symmetry of the thermal radiation shield.

Figure 7:
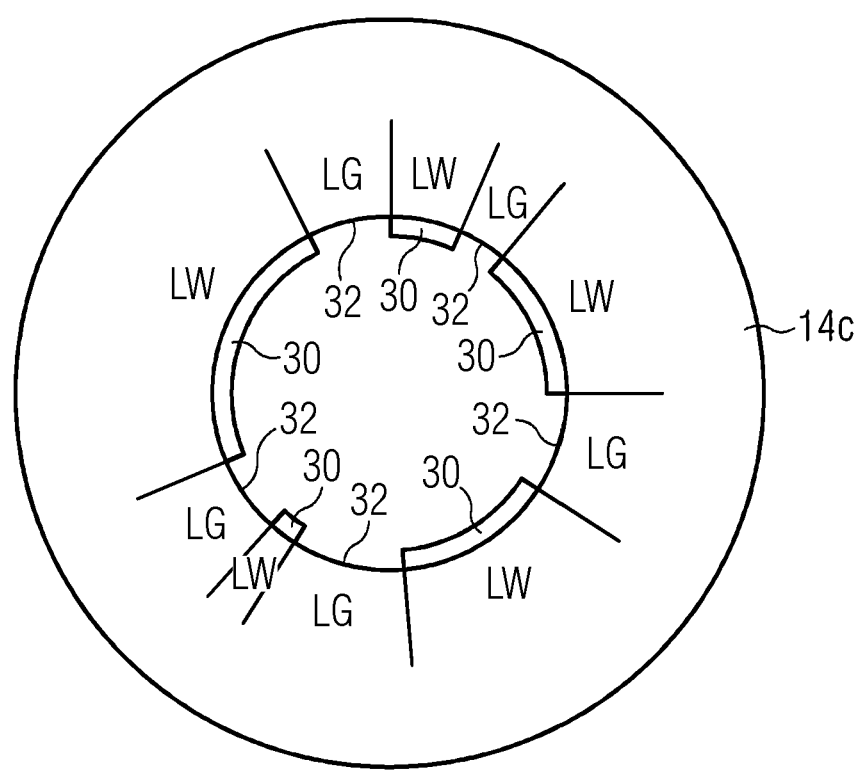
FIG. 7 represents weld arrangements attaching a cylindrical bore tube to annular end walls, and between outer cylindrical wall and annular end walls, according to an exemplary embodiment of the present disclosure.

According to an aspect of an embodiment of the disclosure, lengths of welds LW and lengths of gaps LG are varied, to reduce the tendency of the end wall to oscillate in resonance. FIG. 7 schematically illustrates an embodiment of the disclosure, in the style of FIG. 2, in which weld lengths LW and gap lengths LG are varied around the circumference of the inner diameter of the end wall 14c. In an exemplary embodiment, the total of all weld lengths LW is approximately equal to the total of all gap lengths LG. In other words, the welds extend over approximately 50% of the circumference of the inner diameter of the end wall 14c.

The variation in lengths may be random, generated by a suitable computerised random number generator. However, as the gradient coils will operate at known frequencies, there is a risk that random lengths may unintentionally provide an arrangement which oscillates at a frequency used by the gradient coils. In an exemplary embodiment, the changed lengths of weld and gap may be designed to ensure that the resulting structure does not have a resonant frequency at or near a frequency used by the gradient coils. By designing a predetermined, fixed arrangement of welds and gaps, then an arrangement of cutouts, similar to that shown in FIG. 4, may be provided in each end wall to make welding the end wall 14c to the bore tube 14a easier.

According to an embodiment of the disclosure, as schematically represented in FIG. 7, an end wall 14c of the thermal radiation shield is welded to the bore tube 14a of the thermal radiation shield at intermittent locations, where welds 30 of predetermined, variable lengths LW are spaced apart by gaps 32 of other predetermined, variable lengths LG.

Computer simulations, as well known to those skilled in the art, may be applied to the predetermined, fixed arrangement of welds and gaps to determine whether a thermal radiation shield assembled with such an arrangement of welds is likely to resonate at any frequency likely to be produced by the gradient coils. It may be found beneficial to limit the range in variation in size or number of welds, to ensure that the resultant thermal radiation shield is mechanically robust and resistant to resonance at relevant frequencies. For example, maximum and minimum lengths of welds and/or gaps may be defined, or maximum and minimum ratios of lengths, for example that the longest length of weld LW should be no more than four times the shortest length of weld LW, and/or similarly for lengths of gaps LG.

The illustrated embodiment of the disclosure therefore comprises of a predetermined distribution of the position and length of welds that affix the end wall 14c of the thermal radiation shield to the bore tube 14a of the thermal radiation shield at intermittent locations. The present disclosure seeks to eliminate the mechanical resonances by introducing calculated variation in the mechanical connection of the end wall 14c of the thermal radiation shield to the bore tube 14a of the thermal radiation shield. The calculated variation in the location of the welds will break up the symmetry of the particular problematic mechanical resonance modes which might otherwise be generated at the mechanical connection of end wall 14c to bore tube 14a of the radiation shield 14 and will eliminate/reduce the potential for the development of mechanical resonances.

Certain embodiments of the present disclosure provide a thermal radiation shield for a superconducting magnet device, comprising an annular cylindrical bore tube 14a, an outer cylindrical wall 14b and annular end walls 14c welded between the annular cylindrical bore tube 14a and the outer cylindrical wall 14b to form a closed, hollow cylindrical vessel, wherein a distribution of the position and length of welds that affix the annular end walls 14c to the shield bore tube 14a comprises a predetermined arrangement of welds of varying lengths LW interspersed with gaps of varying lengths LG.

In certain embodiments of the disclosure, a distribution of the position and length of welds that affix the annular end walls 14c to the outer cylindrical wall 14b comprises another predetermined arrangement of welds of varying lengths LW interspersed with gaps of varying lengths LG.

The predetermined arrangement of welds provided by the present disclosure seeks to eliminate problematic mechanical resonances due to gradient coil interaction by introducing pseudo-random variation in the mechanical connection of the shield end walls 14c to the shield bore tube 14a. The pseudo-random arranged of the weld features avoid symmetry of the mechanical connection of shield end walls 14c to the shield bore tube 14a of the radiation shield and will eliminate or reduce the potential for the development of mechanical resonances at frequencies generated by the gradient coils.

The elimination of the problematic modes on the shield end walls 14c will alter the resonant mechanical conditions of the radiation shield 14 and will reduce the transfer of energy from the shield end walls 14c to the bore tube 14a, reducing the excitation of the bore tube 14a and thus reducing the introduction of unwanted magnetic field effects to the imaging volume of the magnet.

The predetermined pseudo-random arrangement the welds can be calculated in a combination of ways. For example, welds may be intentionally located at anti-nodes of problematic mechanical resonance modes, reducing the likelihood of that mode being created. Removal or reduction of weld length at certain locations between bore tube and end walls 14c may be found to reduce the tendency of the bore tube 14b to mechanically resonate. Addition or increase of weld length at certain locations between bore tube and end walls 14c may be found to reduce the tendency of the bore tube 14b to mechanically resonate. In a typical embodiment of the present disclosure, a combination of increase and reduction of weld length is provided, as compared to a conventional arrangement as represented in FIG. 2, and such change in weld and gap locations is found to reduce the tendency of mechanical resonance in the end walls 14c and so to reduce the tendency of the bore tube 14a to vibrate.

The calculated predetermined pseudo-random nature of the welding addition, removal and/or length change reduces the opportunity for large scale mechanical resonance transfer between end walls 14c and bore tube 14a. The elimination or reduction of mechanical resonance on the bore tube 14a due to GC interaction will reduce the unwanted magnetic field effects on the imaging volume in the superconducting magnet.

Eliminating or reducing the modal energy transfer by mechanical resonance due to gradient coil interaction, as provided by the present disclosure, will allow the use of higher power GC systems in superconducting magnet systems with a high sensitivity to magnetic field variation e.g. spectroscopy applications.

In an example embodiment, problematic end spinning modes are identified by a computer simulation, which provides indication of likely mechanical resonance modes such as illustrated in FIGS. 5 and 6. During calculation of the pseudo-random weld pattern of the present disclosure, the arrangement of welds is determined so as to include welds which discourage mechanical resonance at such frequencies. In an exemplary embodiment, the location of the anti-node, that is to say, the location of maximum amplitude of oscillation in mechanical resonance of a particular mode is identified and the weld pattern is adapted to suppress the amplitude of mechanical vibration at that location, therefore reducing the overall amplitude of the mechanical vibration mode in the finished thermal radiation shield. In an exemplary embodiment, modes on the end walls 14c and bore tube 14a that have a similar resonant frequencies are identified, and a weld pattern is designed that specifically targets those modes. For such modes, there is an increased likelihood of energy transfer between modes, which such embodiments of the disclosure may accordingly suppress. An example of such an embodiment would be a 240 Hz mechanical resonance mode that is typical for this size/material type used in a whole-body MRI magnet. By appropriate selection of the weld locations the 240 Hz mode can be suppressed, improving the imaging and GCI performance of the magnet system.

In some embodiments of the present disclosure, with reference to a conventional arrangement, the weld joint between the end walls 14c of the thermal radiation shield 14 and the bore tube 14a of the thermal radiation shield 14 has extra material added to it by increasing weld lengths LW, in a pseudo random pattern. The pseudo-randomness of the extra added weld material breaks up the mechanical symmetry of the joint thus reducing the effects of mechanical resonance caused by gradient coil interaction.

In other embodiments of the present disclosure, with reference to a conventional arrangement, the weld joint between the end walls 14c of the thermal radiation shield 14 and the bore tube 14a of the thermal radiation shield 14 has material removed from joint, typically by not applying it in the first place, to reduce weld lengths LW, in a pseudo random pattern. The pseudo-randomness of the removed or omitted weld material breaks up the mechanical symmetry of the joint thus reducing the effects of mechanical resonance caused by gradient coil interaction.

A computer simulation can be used to generate the required pseudo-random distribution of welding addition or reduction/omission. The design should avoid large scale repetitive patterns, and a similar amount of material modification should be provided on both end walls 14c of the thermal radiation shield 14 to ensure that, during a magnet quench, that there are no net forces tending to move the thermal radiation shield 14 in any particular direction. The strength of the end wall 14c to bore tube 14a joint is typically sufficient to withstand the quench force loading.

The size and shape of the welding addition/removal/length change is varied according to the frequency ranges of interest where maximum energy transfer reduction is advantageous.

The invention claimed is:

1. AA device for use in magnetic resonance imaging (MRI) systems, comprising:
    a superconducting main magnet coil; and
    a thermal radiation shield that encloses the superconducting main magnet coil and includes an inner cylindrical bore tube, an outer cylindrical wall, and annular end walls welded between the annular cylindrical bore tube and the outer cylindrical wall to form a closed, hollow cylindrical vessel,
    wherein a distribution of a position and length of welds that affix the annular end walls to the inner cylindrical bore tube comprises, in a circumferential direction of the inner cylindrical bore tube, a predetermined arrangement of welds of varying lengths, in the in the circumferential direction, interspersed with gaps of varying lengths, in the circumferential direction.

2. The device according to claim 1, wherein the distribution further comprises another predetermined arrangement of welds of varying lengths interspersed with gaps of varying lengths.

3. The device according to claim 1, wherein a total of all weld lengths is equal to a total of all gap lengths.

4. A magnetic resonance imaging (MRI) system comprising the device according to claim 1.

5. The device according to claim 2, wherein a total of all weld lengths is equal to a total of all gap lengths.

6. The device according to claim 1, wherein the welds directly affix the annular end walls to the inner cylindrical bore tube.

7. A method of manufacture of a device including a thermal radiation shield and for use in magnetic resonance imaging (MRI) systems, the method comprising:
    locating welds at anti-nodes of known mechanical resonance modes of the thermal radiation shield, wherein the locating of the welds is constrained by maximum and minimum ratios of lengths of welds; and
    manufacturing the thermal radiation shield with the located welds.

8. The method according to claim 7, wherein the locating of the welds is further constrained by maximum and minimum lengths of welds and/or gaps between adjacent welds.

9. The method according to claim 7, wherein the locating of welds is further constrained by maximum and minimum ratios of lengths of gaps between adjacent welds.

10. The method according to claim 7, wherein:
    the thermal radiation shield includes an inner cylindrical bore tube, an outer cylindrical wall, and annular end walls; and
    manufacturing the thermal radiation shield comprises:
        welding the annular end walls to the inner cylindrical bore tube in a predetermined arrangement of welds of varying lengths interspersed with gaps of varying lengths.

11. The method according to claim 10, wherein the annular end walls are welded between the annular cylindrical bore tube and the outer cylindrical wall to form a closed, hollow cylindrical vessel.

12. The method according to claim 10, wherein the device further comprises a superconducting main magnet coil, the thermal radiation shield being formed to enclose the superconducting main magnet coil.

13. The method according to claim 7, wherein the locating of the welds is further constrained by maximum and minimum lengths of welds and gaps between adjacent welds.

14. The method according to claim 7, wherein the thermal radiation shield includes an inner cylindrical bore tube, an outer cylindrical wall, and annular end walls welded between the annular cylindrical bore tube and the outer cylindrical wall to form a closed, hollow cylindrical vessel.

15. The method according to claim 14, wherein the device further comprises a superconducting main magnet coil, the thermal radiation shield being formed to enclose the superconducting main magnet coil.

16. The method according to claim 7, wherein the device further comprises a superconducting main magnet coil, the thermal radiation shield being formed to enclose the superconducting main magnet coil.

17. A device for use in magnetic resonance imaging (MRI) systems, comprising:
    a superconducting main magnet coil; and
    a thermal radiation shield that encloses the superconducting main magnet coil and includes an inner cylindrical bore tube, an outer cylindrical wall, and annular end walls welded between the annular cylindrical bore tube and the outer cylindrical wall to form a closed, hollow cylindrical vessel,
    wherein a distribution of a position and length of welds that directly affix the annular end walls to the inner cylindrical bore tube comprises a predetermined arrangement of welds of varying lengths interspersed with gaps of varying lengths.

18. The device according to claim 17, wherein the varying lengths of the gaps are with respect to a circumferential direction of the inner cylindrical bore tube.

19. The device according to claim 18, wherein the varying lengths of the welds are with respect to the circumferential direction.

\* \* \* \* \*